United States Patent [19]
Hatta

[11] Patent Number: 5,488,540
[45] Date of Patent: Jan. 30, 1996

[54] PRINTED CIRCUIT BOARD FOR REDUCING NOISE

[75] Inventor: Hironobu Hatta, Okazaki, Japan

[73] Assignee: Nippondenso Co., Ltd., Kariya, Japan

[21] Appl. No.: 178,183

[22] Filed: Jan. 18, 1994

[30] Foreign Application Priority Data

Jan. 19, 1993 [JP] Japan ................... 5-006627

[51] Int. Cl.⁶ .................. H05K 1/11; H05K 7/06; H03H 7/00
[52] U.S. Cl. .......... 361/794; 174/260; 174/261; 333/165; 333/181; 333/185; 361/777; 361/782; 361/792; 361/795
[58] Field of Search .............. 174/35 R, 255, 174/260, 261; 257/659, 660, 728, 723, 724; 333/12, 181, 185, 246, 247, 172, 165; 361/748, 760, 777, 778, 780, 784, 790, 792, 793, 794, 795, 816, 818, 212, 220, 782, 783; 439/68, 69, 74; 307/89, 91; 455/75

[56] References Cited

U.S. PATENT DOCUMENTS

| | | | |
|---|---|---|---|
| 4,954,929 | 9/1990 | Baran | 361/818 |
| 4,973,799 | 11/1990 | Soma et al. | 174/260 |
| 5,023,753 | 6/1991 | Abe | 361/782 |
| 5,068,631 | 11/1991 | Vince | 333/181 |

FOREIGN PATENT DOCUMENTS

| | | |
|---|---|---|
| 63-108664 | 7/1988 | Japan . |
| 290587 | 3/1990 | Japan . |
| 2177587 | 7/1990 | Japan . |
| 2110399 | 9/1990 | Japan . |

Primary Examiner—Donald A. Sparks
Attorney, Agent, or Firm—Cushman, Darby & Cushman

[57] ABSTRACT

A multi-layered printed circuit board is provided. This printed circuit board includes generally a substrate formed with first and second base layers, a first conductive pattern block formed on a surface of the first base layer of the substrate to connect with a power terminal of an IC mounted on an opposite surface of the first base layer, a second conductive pattern block formed on the second base layer to connect with a grounding terminals of the IC, a power conductor arranged in the same plane as the first conductive pattern blocks at a preselected interval therebetween, a grounding conductor arranged in the same plane as the second conductive pattern blocks at a preselected interval therebetween, a first EMI filter provided adjacent the IC in connection with the first conductive pattern block for reducing noise concentrated on the first conductive pattern block, and a second EMI filter provided adjacent the IC in connection with the second conductive pattern block for reducing noise concentrated on the second conductive pattern block.

17 Claims, 4 Drawing Sheets

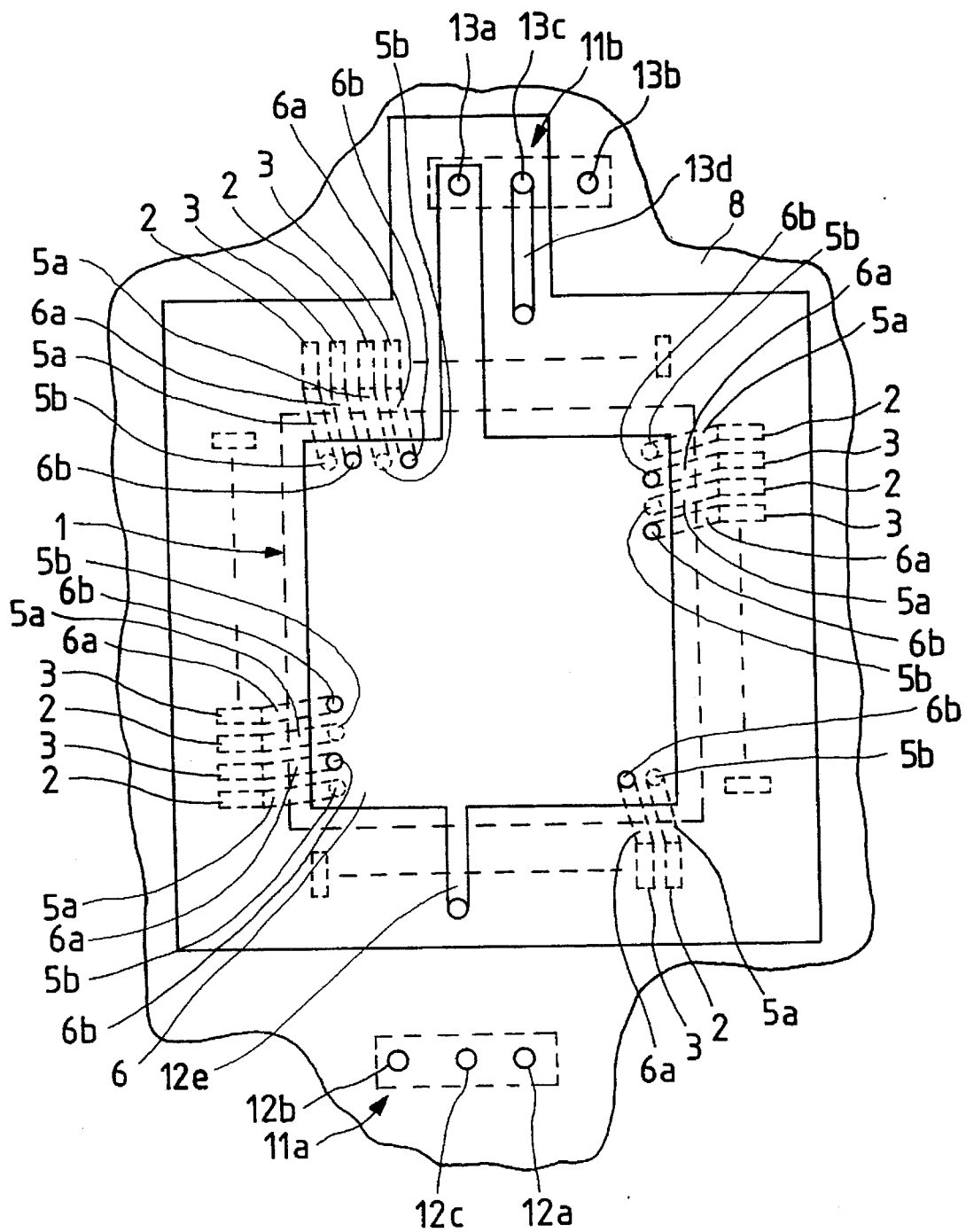

PRINTED CIRCUIT BOARD FOR REDUCING NOISE

BACKGROUND OF THE INVENTION

1. Technical Field of the Invention

The present invention relates generally to printed circuit boards, and more particularly to an improved printed circuit board having a compact and economical structure designed to reduce noise raised from an electronic circuit component such as an integrated circuit (IC) mounted thereon.

2. Background Art

In recent years, high-speed electronic circuits are being developed. Elevating clock frequency of an IC for speeding up its operation causes noise generated by the IC to be increased. For reducing the increased noise, an electromagnetic interference (EMI) filter is commonly used which is arranged adjacent a connector connecting an electronic control unit provided with ICs and an external device.

Such an arrangement, however, encounters a drawback in that EMI filters of the same number as that of connector pins is required, consuming valuable mounting space.

In addition, when control becomes complex, and the number of controlled systems is increased, a great many connector pins are required, resulting in a large-number of EMI filters being needed for reducing noise to acceptable levels.

For avoiding such a drawback, Japanese Patent First Publication No. 2-90587 discloses an arrangement wherein a capacitor is arranged in a circuit for reducing the circuit noise. This prior art however, does not teach a circuit arrangement in detail.

SUMMARY OF THE INVENTION

It is therefore a principal object of the present invention to avoid the disadvantages of the prior art.

It is another object of the present invention to provide a printed circuit board on which a compact printed wiring is formed to reduce any unwanted electrical disturbance or noise with a small number of noise-reducing elements.

According to one aspect of the present invention, there is provided a printed circuit board designed to mount thereon an IC having a plurality of terminals therearound and an electronic circuit component which comprises a plurality of mounting conductors formed on a substrate in connection with the terminals of the IC, a common conductor formed on the substrate designed to provide electric potential common to the IC and the electric circuit component or to connect the electric circuit component to ground, a conductive pattern block formed on the substrate at a location overlapping with a mounting area of the IC, the conductive pattern block being arranged to connect with the common conductor only through a preselected portion and to connect with the terminals of the IC having the same electric potential as that of the common conductor, and a noise-reducing element provided on the preselected portion to reduce noise transmitted from the conductive pattern block to the common conductor.

According to another aspect of the present invention, there is provided a printed circuit board which comprises a substrate including first and second base layers, a first conductive pattern block formed on a surface of the first base layer of the substrate to connect with a power terminal of an IC mounted on an opposite surface of the first base layer, a second conductive pattern block formed on the second base layer to connect with a grounding terminal of the IC, a power conductor arranged horizontally to one of the first and second conductive pattern blocks at a preselected interval therebetween, a grounding conductor arranged horizontally to the other of the first and second conductive pattern blocks at a preselected interval therebetween, a first noise-reducing filter provided adjacent the IC, the first noise-reducing filter having a terminal which extends through a thickness of the first base layer to connect with the first conductive pattern block for reducing noise concentrated on the first conductive pattern block, and a second noise-reducing filter provided adjacent the IC, the second noise-reducing filter having a terminal which extends through thicknesses of the first and second base layers to connect with the second conductive pattern block for reducing noise concentrated on the second conductive pattern block.

In the preferred mode, first and second mounting conductors are further provided. The first mounting conductor is arranged to connect the power terminal of the IC and the first conductive pattern block, while the second mounting conductor is arranged to connect the grounding terminal of the IC and the second conductive pattern block.

The first and second conductive pattern blocks are printed in an area, respectively, which are substantially the same as a mounting area of the IC at the location overlapping with the entire surface of the IC.

The first noise-reducing element has first, second, and third terminals, two inductances being arranged in series between the first and second terminals, a capacitor being provided between a connection of the inductances and the third terminal. The first terminal connects with the first conductive pattern block, the second terminal connecting with the power conductor, and the third terminal connecting with the second conductive pattern block. The second noise-reducing element also has first, second, and third terminals, two inductances being arranged in series between the first and second terminals, a capacitor being provided between a connection of the inductances and the third terminal. The first terminal connects with the second conductive pattern block, the second terminal connecting with the grounding conductor, and the third terminal connecting with the first conductive pattern block.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIG. 3 is a plan view which shows a conductive pattern printed on a third layer of a printed circuit board of the invention.

DESCRIPTION OF THE PREFERRED EMBODIMENT

Figure 1:
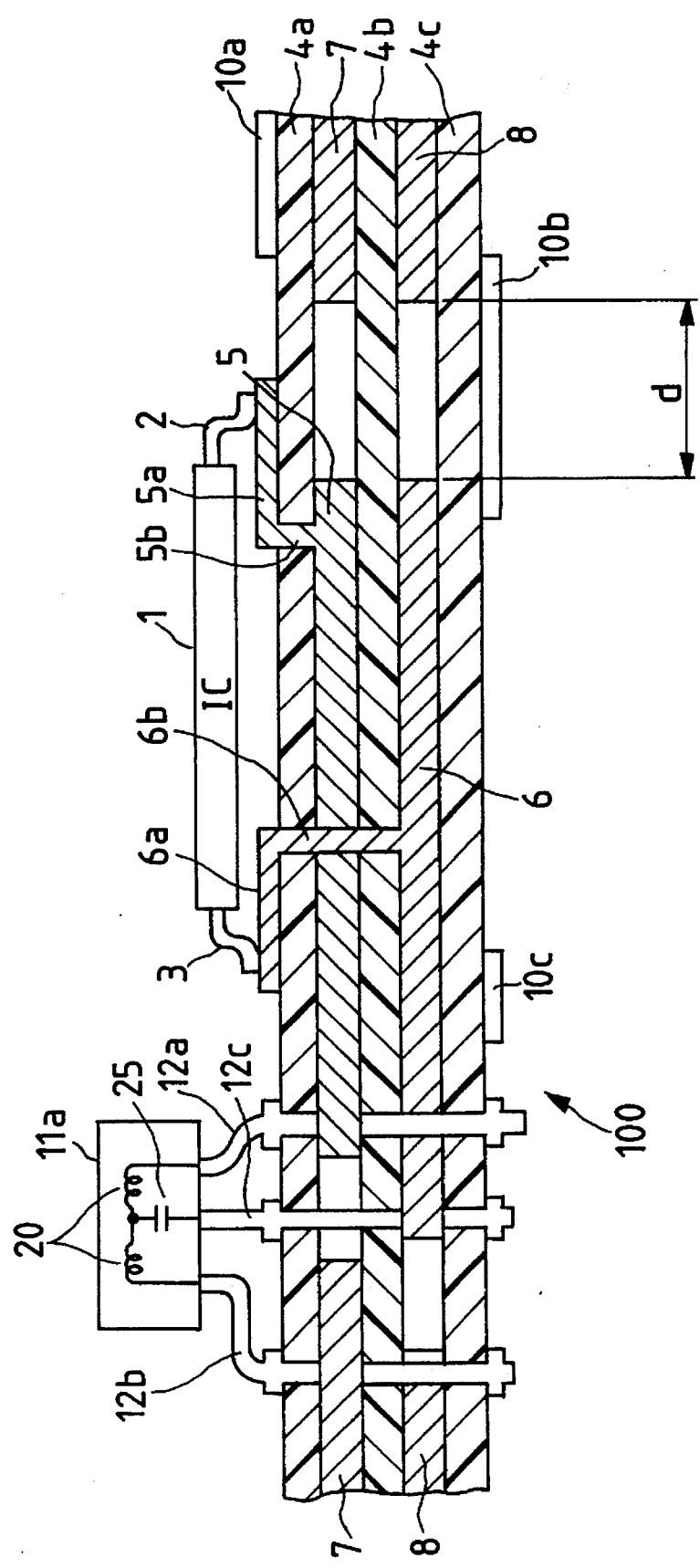
FIG. 1 is a cross-sectional view which shows a printed circuit board having a compact circuit arrangement suitable for mounting a noise-reducing element.
Figure 2:
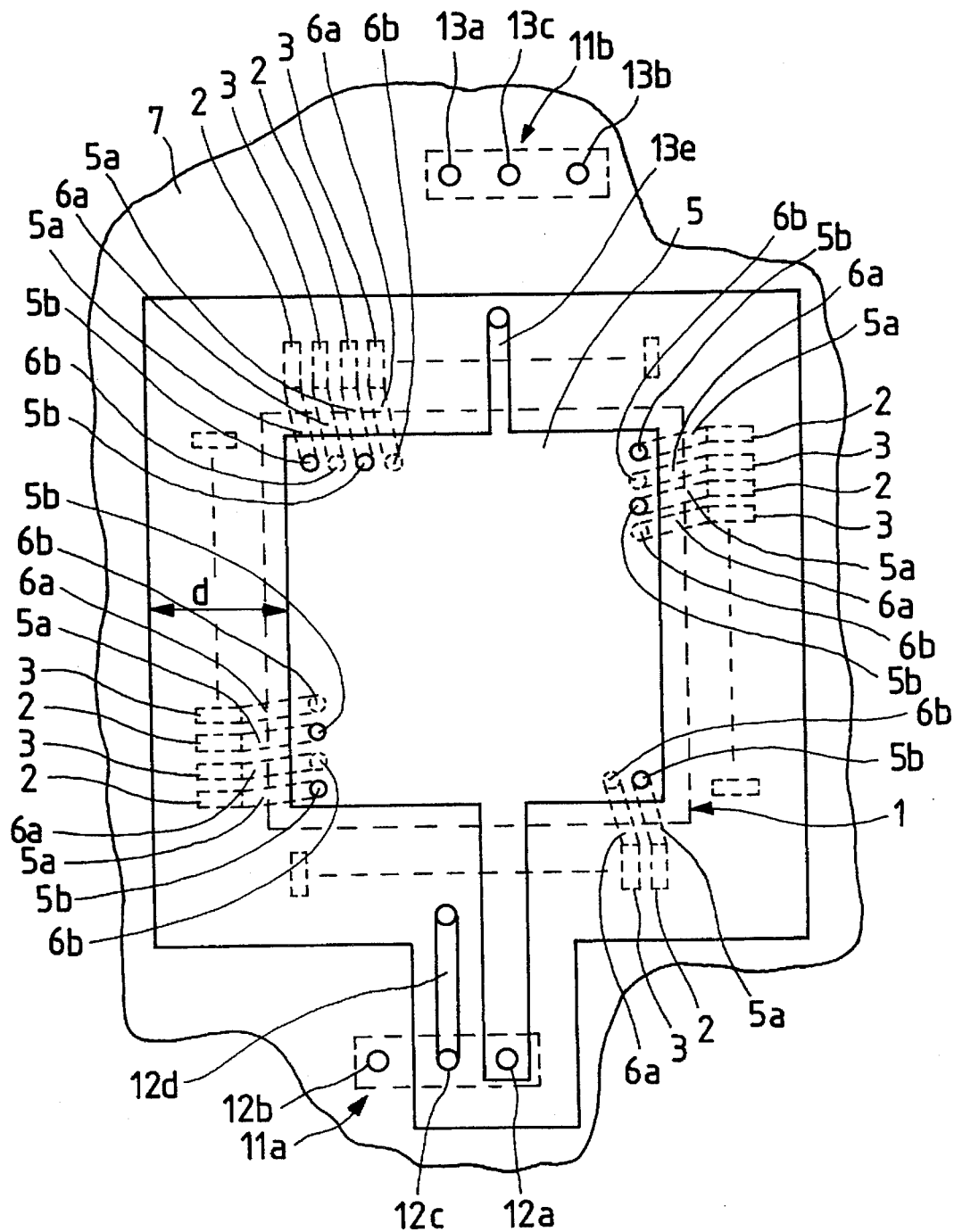
FIG. 2 is a plan view which shows a conductive pattern printed on a second layer of a printed circuit board of the invention.

Referring now to the drawings, wherein like numbers refer to like parts in several views. In FIG. 1, there is shown a printed circuit board 100 according to the present invention. The printed circuit board 100 includes three resin-made insulating base layers 4a, 4b, and 4c to form four circuit layers. FIG. 2 shows a conductive pattern printed on the second circuit layer. FIG. 3 shows a conductive pattern printed on the third circuit layer.

The printed circuit board 100 includes predetermined conductive patterns of printed wiring lines 10a, 10b, and 10c formed on outer surfaces thereof.

Mounted on the first insulating base layer 4a are an integrated circuit (IC) 1 having a plurality of terminals therearound and electromagnetic interference (EMI) filters 11a and 11b. The IC 1 is electrically connected to some circuit components (not shown) through the printed wiring lines 10a, 10b, and 10c. The IC 1 and the circuit components are connected to a printed power conductor 7 and a printed grounding conductor 8, as will be described hereinafter in detail, so that they are applied with electric power from an external source.

Output and input terminals of the IC 1 and the circuit components are attached to the printed circuit board 100 which are, in turn, coupled with connectors communicating with external controlled devices (not shown). The terminals of the IC 1 includes seven power terminals 2 and seven grounding terminals 3 which are, as shown by broken lines in FIGS. 2 and 3, arranged around its periphery at the same potential. It is found in the art that most of noise generated in the IC 1 is usually created from the power and the grounding terminals 2 and 3. The power terminals 2 are connected to mounting conductors 5a, respectively, printed on the circuit board 100, while the grounding terminals 3 are connected to mounting conductors 6a, respectively, printed on the circuit board 100.

The circuit board 100, as stated above, includes the insulating base layers 4a, 4b, and 4c. Between the insulating base layers 4a and 4b, a first conductive pattern block 5 is, as shown in FIG. 2, formed which is a square. The first conductive pattern block 5 is arranged beneath the IC 1. In other words, the first conductive pattern block 5 has substantially the same mounting area as that of the IC 1 so that its entire surface overlaps with the IC 1. The first conductive pattern block 5 is connected to the mounting conductors 5a via through holes 5b formed in the insulating layer 4a. With this arrangement, any noise output from all the power terminals 2 of the IC 1 is concentrated on the first conductive pattern block 5.

The first conductive pattern block 5 is so constructed as to have its mounting area which minimizes Intervals between same and the power terminals 2 distributed around the periphery of the IC 1 so that distances between the mounting conductors 5a and the through holes 5b become shortened, thereby minimizing noise output therefrom.

The power conductor 7 arranged between the insulating base layers 4a and 4b serves as a common conductor providing the same potential as those of the power terminals 2 of the IC 1 and power terminals of the circuit components mounted on the circuit board 100. The power conductor 7 is arranged around the first conductive pattern block 5 at a preselected interval d therefrom so that it is placed outside the terminals of the IC 1. This prevents the noise concentrated on the first conductive pattern block 5 from being transmitted to the power conductor 7, and also prevents the power conductor 7 from being adversely affected by the noise output from the terminals of the IC 1. In this embodiment, the interval d between the power conductor 7 and the first conductive pattern block 5 is set to 8 mm.

Arranged between the insulating base layers 4b and 4c is a second conductive pattern block 6 which is a square. Likewise to the first conductive pattern block 5, the second conductive pattern block 6 is formed at a location corresponding to a mounting area of the IC 1, and is connected to the mounting conductors 6a via through holes 6b extending through the insulating base layer 4a, the first conductive pattern block 5, and the insulating base layer 4b. Therefore, any noise output from all the grounding terminals 3 of the IC 1 is concentrated on the second conductive pattern block 6. In addition, the second conductive pattern block 6, as similar to the first conductive pattern block 5, has the mounting area sized to minimize intervals between same and the grounding terminals 3 distributed around the periphery of the IC 1, thereby reducing noise output leaking from the mounting conductors 6a and the through holes 6b.

The grounding conductor 8 arranged between the insulating base layers 4b and 4c serves as a common conductor providing the same potential as those of the grounding terminals 3 of the IC 1 and grounding terminals of the circuit components mounted on the circuit board 100. The grounding conductor 8 is placed around the second conductive pattern block 6 at the same interval d as that of the power conductor 5 from the first conductive pattern block 5 so that it lies outside the terminals of the IC 1. This prevents the noise concentrated on the second conductive pattern block 6 from being transmitted to the grounding conductor 8, and also prevents the grounding conductor 8 from being adversely affected by the noise output from the terminals of the IC 1.

The EMI filter 11a functions as a noise-reducing element which is designed to change a frequency band of noise to be reduced by modifying a filter coefficient. The EMI filter 11a has three terminals 12a, 12b, and 12c. Between the terminals 12a and 12b, two inductances 20 are arranged in series. A capacitor 25 is provided between a connection of the inductances 20 and the terminal 12c. The terminal 12a is connected to the first conductive pattern block 5, the terminal 12b is connected to the power conductor 7, and the terminal 12c is connected to the second conductive pattern block 6. The terminal 12c is arranged as a common terminal of the EMI filter 11a which is connected to a conductor 12d, as shown in FIG. 2, formed on the second circuit layer. The conductor 12d is then connected to a conductor 12e which, as shown in FIG. 3, extends from the second conductive pattern block 6 formed on the third circuit layer. The terminals 12a, 12b, and 12c are isolated from conductors other than the conductors 7, 12d, and 12e.

With the above circuit arrangements, electric power is supplied from the power conductor 7 to the power terminals 2 of the IC 1 through the terminal 12b, the inductances of the EMI filter 11a, the terminal 12a, the first conductive pattern block 5, the through holes 5b, the mounting conductor 5a. The noise transmitted from the power terminal 2 to the first conductive pattern block 5 is reduced by the capacitors and inductances in the EMI filter 11a.

As explained above, the first conductive pattern block 5 is connected to the power conductor 7 only through the EMI filter 11a. The noise concentrated in the first conductive pattern block 5 is, thus, sufficiently reduced by the EMI filter 11a prior to the power conductor 7, thereby preventing the noise from being transmitted outside the first conductive pattern block 5. It will be appreciated that the noise is prevented from being transmitted to the circuit components mounted on the circuit board 100 through the power conductor 7, which may be transmitted from the input and output terminals of the circuit components out of the connectors of the circuit board 100.

The common terminal 12c of the EMI filter 11a may alternatively be connected to any of the first conductive pattern block 5, the power conductor 7, and the grounding conductor 8.

The EMI filter 11b is, similar to the EMI filter 11a, designed to change a frequency band of noise to be reduced by modifying a filter coefficient, and has three terminals 13a, 13b, and 13c and the same internal structure as the EMI filter 11a. The terminals 13a is connected to the second conductive pattern block 6, the terminal 13b is connected to the grounding conductor 8, and the terminal 13c is connected to the first conductive pattern block 5. The terminal 13c is provided as a common terminal of the EMI filter 11b which is connected to a conductor 13d, as shown in FIG. 3, formed on the third circuit layer. The conductor 13d is then connected to a conductor 13e which, as shown in FIG. 2, extends from the first conductive pattern block 5. The terminals 13a, 13b, and 13c are isolated from conductors other than the conductors 8, 13d, and 13e.

Accordingly, electric power supplied from the power terminals 2 to the IC 1 flows from the grounding terminals 3 to the grounding conductor 8 through the mounting conductors 6a, the through holes 6b, the second conductive pattern block 6, the terminal 13a, inductances of the EMI filter 11b, and the terminal 13b. The noise transmitted from the grounding terminal 3 to the second conductive pattern block 6 is reduced by the capacitors and inductances in the EMI filter 11b.

The second conductive pattern block 6 is, as stated above, connected to the grounding conductor 8 only through the EMI filter 11b. Thus, the noise concentrated on the second conductive pattern block 6 is effectively reduced by the EMI filter 11b prior to the grounding conductor 8, thereby preventing the noise from being transmitted outside the second conductive pattern block 6. It will be appreciated that the noise is prevented from being transmitted to the circuit components mounted on the circuit board 100 through the grounding conductor 8, which will be transmitted from the input and output terminals of the circuit components out of the connectors of the circuit board 100.

The common terminal 13c of the EMI filter 11b may alternatively be connected to any of the second conductive pattern block 6, the power conductor 7, and the grounding conductor 8.

With the above arrangements of the printed circuit board 100, the noise raised from the power terminal 2 of the IC 1 is concentrated on the first conductive pattern block 5. The first conductive pattern block 5, as already mentioned, electrically communicates with the power conductor 7 only through a preselected portion on which the EMI filter 11a is mounted, and thus, the noise is reduced by the EMI filter 11a prior to the power conductor 7. Additionally, the first conductive pattern block 5 is located away from the power conductor 7 at the interval d. This prevents the noise from being transmitted to the power conductor 7 around the first conductive pattern block 5.

Similarly, the noise generated from the grounding terminal 3 is concentrated on the second conductive pattern block 6, which, in turn, is reduced by the EMI filter 11b to acceptable levels. The second conductive pattern block 6 is, similar to the first conductive pattern block 5, is located away from the grounding conductor 8 at the interval d, thereby preventing the noise from being propagated to the grounding conductor 8 around the second conductive pattern block 6.

Figure 4A:
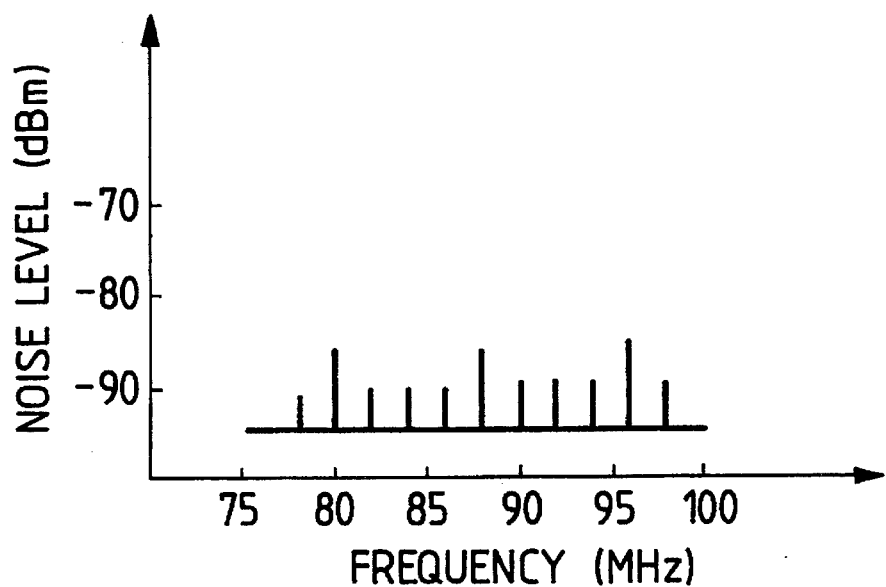
FIG. 4(a) is a graph which shows the relation between noise frequencies and a reduction in noise level produced by a printed circuit board according to the invention.
Figure 4B:
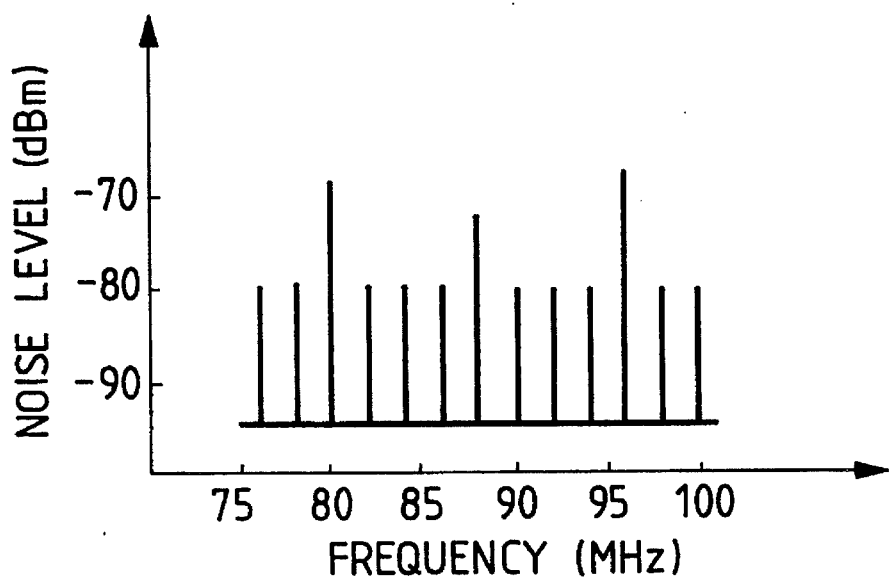
FIG. 4(b) is a graph which shows the relation between noise frequencies and a reduction in noise level produced by a conventional printed circuit board.

FIG. 4(a) shows noise reduction effects in an FM frequency range from 76 to 100 MHz produced by the printed circuit board 100. FIG. 4(b) shows a comparative example wherein a capacitor is disposed between the power terminal 2 of the IC 1 and the grounding terminal 3. The noise reduction is measured by a spectrum analyzer.

FIG. 4(b) shows that there is noise greater than −70 (dBm) at frequencies of 80 (MHz) and 96 (MHz). In general, noise greater in level than −80 (dBm) causes a radio set mounted in automotive vehicles to raise noise, resulting in inaudible sound. Therefore, it is found that the comparative example cannot reduce the noise to desired levels.

FIG. 4(a) shows that the noise is reduced lower than −85 (dBm) over the range from 76 to 100 (MHz). It will be noted that the printed circuit board 100 is effective to reduce the noise to an acceptable level.

In addition, it will be appreciated that, as long as a plurality of EMI filters are, as in the prior art arrangement discussed previously, provided near the connectors of the IC for preventing noise from leaking out, the same noise reduction effects, as shown in FIG. 4(a), are established. Such an arrangement however, requires the EMI filters of the same number as that of the input/output terminals of the IC (e.g., 120). In contrast, the printed circuit board of the invention requires only two EMI filters 11a and 11b. The number of EMI filters are, therefore, decreased greatly as compared with the prior art arrangement, and the amount of arrangement space of the EMI filter is also reduced.

Further, the first and second conductive pattern blocks 5 and 6 are arranged to overlap with the mounting location of the IC 1 having a plurality of terminals therearound. This arrangement avoids the printed circuit board 100 from increasing in size although the first and second conductive pattern blocks 5 and 6 consume valuable area of the circuit board 100.

Additionally, the area of the first conductive pattern block 5 is provided as wide as possible for connection to all the seven power terminals 2 arranged around the IC 1. The increase in area of the first conductive pattern block 5 decreases impedance thereof. This makes it easy to transmit noise from the power terminals to the pattern block 5, thereby blocking the noise therewithin to prevent the noise from adversely affecting the functions of surrounding circuit components.

Moreover, in the above embodiment, all the power terminals 2 and the grounding terminals 3 are collected onto the single pattern blocks 5 and 6, respectively. It should be noted however, that the present invention is not limited to the same and that a plurality of pattern blocks may be provided for the power terminals and the grounding terminals, respectively.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A printed circuit board adapted for connection with an IC via a plurality of IC mounting terminals including at least an IC power terminal and an IC ground terminal, said printed circuit board comprising:

an IC mounting area over which an IC can be mounted;

first and second mounting conductors adapted to be connected with the IC power terminal and IC ground terminal, respectively;

first and second conductive pattern blocks formed at locations overlapping the IC mounting area, said first and second conductive pattern blocks being connected with said first and second mounting conductors, respectively;

a first common conductor for electrical connection with the IC power terminal through said first conductive pattern block and said first mounting conductor;

a second common conductor for electrical connection with the IC ground terminal through said second conductive pattern block and said second mounting conductor;

a first noise-reducing element electrically connecting said first conductive pattern block and said first common conductor to reduce noise transmitted from said first conductive pattern block to said first common conductor;

a second noise-reducing element electrically connecting said second conductive pattern block and said second common conductor to reduce noise transmitted from said second conductive pattern block to said second common conductor; and a first insulating base layer for insulating said first common conductor from said second common conductor and said first conductive pattern block from said second conductive pattern block.

2. A printed circuit board as set forth in claim 1, wherein said IC mounting area is provided by a second insulating base layer, said second insulating base layer having a surface area on which the IC is to be mounted and an opposite surface area disposed adjacent to said first conductive pattern block, said first insulating base layer having a surface area adjacent said first conductive pattern block and an opposite surface area adjacent said second conductive pattern block.

3. A printed circuit board as set forth in claim 1, wherein said first and second common conductors are arranged in surrounding spaced relation with respect to said first and second conductive pattern blocks, respectively, for preventing noise concentrated on said first and second conductive pattern blocks from being transmitted to said first and second common conductors, respectively.

4. A printed circuit board as set forth in claim 3, wherein said first common conductor is spaced about 8 mm from said first conductive pattern block, and said second common conductor is spaced about 8 mm from said second conductive pattern block.

5. A printed circuit board as set forth in claim 1, wherein said first and second conductive pattern blocks are both square in shape.

6. A printed circuit board as set forth in claim 1, wherein said first and second conductive pattern blocks have substantially the same configuration.

7. A printed circuit board comprising:

a substrate including first and second base layers;

a first conductive pattern block formed on a surface of the first base layer of said substrate to connect with a power terminal of an IC mounted on an opposite surface of the first base layer;

a second conductive pattern block formed on the second base layer to connect with a grounding terminal of the IC;

a power conductor arranged horizontally to one of said first and second conductive pattern blocks at a preselected interval therebetween;

a grounding conductor arranged horizontally to the other of said first and second conductive pattern blocks at a preselected interval therebetween;

a first noise-reducing filter provided adjacent the IC, said first noise-reducing filter having a terminal which extends through a thickness of the first base layer to connect with said first conductive pattern block for reducing noise concentrated on said first conductive pattern block; and a second noise-reducing filter provided adjacent the IC, said second noise-reducing filter having a terminal which extends through thicknesses of the first and second base layers to connect with said second conductive pattern block for reducing noise concentrated on said second conductive pattern block.

8. A printed circuit board as set forth in claim 7, further comprising first and second mounting conductors, said first mounting conductor being arranged to connect the power terminal of the IC and said first conductive pattern block, said second mounting conductor being arranged to connect the grounding terminal of the IC and said second conductive pattern block.

9. A printed circuit board as set forth in claim 7, wherein said first and second conductive pattern blocks are printed in an area, respectively, which are substantially the same as a mounting area of the IC at the location overlapping with the entire surface of the IC.

10. A printed circuit board as set forth in claim 7, wherein said first noise-reducing element has first, second, and third terminals, two inductances being arranged in series between the first and second terminals, a capacitor being provided between a connection of the inductances and the third terminal, the first terminal connecting with the first conductive pattern block, the second terminal connecting with the power conductor, the third terminal connecting with the second conductive pattern block, said second noise-reducing element also having first, second, and third terminals, two inductances being arranged in series between the first and second terminals, a capacitor being provided between a connection of the inductances and the third terminal, the first terminal connecting with the second conductive pattern block, the second terminal connecting with the grounding conductor, the third terminal connecting with the first conductive pattern block.

11. A printed circuit board adapted for connection with an IC via a plurality of IC mounting terminals including at least an IC power terminal and an IC ground terminal, said printed circuit board comprising:

first and second insulating base layers, said first insulating base layer providing an IC mounting area over which an IC can be mounted;

first and second mounting conductors formed on said second insulating base layer and adapted to be connected with the IC power terminal and the IC ground terminal, respectively;

first and second conductive pattern blocks both having a generally square shape, said first conductive pattern block being arranged between said first and second insulating base layers at a location overlapping with said IC mounting area, said first conductive pattern block being electrically connected with said first mounting conductor, said second conductive pattern block being disposed adjacent said second insulating base layer on a side of said second insulating base layer opposite a side on which the first conductive pattern block is disposed at a location overlapping with the IC mounting area, said second conductive pattern block being electrically connected with said second mounting conductor;

first and second common conductors, said first common conductor being arranged between said first and second insulating base layers, said second common conductor being disposed on a side of the second insulating base layer opposite a side on which the first common conductor is disposed, the first common conductor adapted to be connected with the IC power terminal through said first conductive pattern block and said first mounting conductor, the second common conductor adapted to be connected with the IC ground terminal through said second conductive pattern block and said second mounting conductor; and first and second noise-reducing elements, said first noise-reducing element being electrically connected between said first conductive pattern block and said first common conductor to reduce noise transmitted from said first conductive pattern block to said first common conductor, said second noise-reducing element being electrically connected between said second conductive pattern block and said second common conductor to reduce noise transmitted from said second conductive pattern block to said second common conductor.

12. A printed circuit board adapted for connection with an IC via a plurality of IC mounting terminals including at least an IC power terminal and an IC ground terminal, said printed circuit board comprising:

an IC mounting area over which an IC can be mounted;

mounting conductors adapted to be connected with the IC mounting terminals;

a common conductor assembly including a power conductor and a grounding conductor;

a conductive pattern block assembly including first and second conductive pattern blocks disposed in overlapping relation with the IC mounting area, said conductive pattern block assembly being electrically connected with said common conductor assembly solely through at least one predetermine electrical path, said first conductive pattern block adapted to be electrically connected with the IC power terminal through a first portion of said mounting conductors, said second conductive pattern block adapted to be connected with the IC ground terminal through a second portion of said mounting conductors, said first and second conductive pattern blocks being disposed in spaced relation with respect to the power conductor and the grounding conductor, respectively, for preventing noise concentrated on the first and second conductive pattern blocks from being transmitted to the power and grounding conductors, respectively; and a noise-reducing element provided within said at least one predetermined electrical path for reducing noise transmitted from said conductive pattern block assembly to said common conductor assembly.

13. A printed circuit board as set forth in claim 12, wherein said first and second conductive pattern blocks both have a square pattern.

14. A printed circuit board as set forth in claim 12, wherein said noise-reducing element comprises:

a first terminal connected with the first conductive pattern block;

a second terminal connected with the power terminal;

a third terminal connected with the second conductive pattern block;

two inductors connected to one another at a node, said inductors disposed in series between said first and second terminals; and a capacitor connected between said node and said third terminal.

15. A printed circuit board as set forth in claim 12, wherein said noise-reducing element comprises:

a first terminal connected with the first conductive pattern block;

a second terminal connected with the power terminal;

a third terminal being connected with one of said first conductive pattern block, said power conductor, and said grounding conductor;

two inductors connected to one another at a node, said inductors disposed in series between said first and second terminals; and a capacitor connected between said node and said third terminal.

16. A printed circuit board as set forth in claim 12, further comprising a second noise-reducing element including:

a first terminal connected with the second conductive pattern block;

a second terminal connected with the grounding conductor;

a third terminal connected with the first conductive pattern block;

two inductors connected to one another at a node, said inductors disposed in series between the first and second terminals; and a capacitor connected between said node and said third terminal.

17. A printed circuit board as set forth in claim 12, further comprising an insulating base layer for insulating said power conductor from said grounding conductor and for insulating said first conductive pattern block from said second conductive pattern block, said insulating base layer having a thickness less than a distance between the first conductive pattern block and the power conductor and also less than a distance between the second conductive pattern block and the grounding conductor.

* * * * *